United States Patent
Chen et al.

(10) Patent No.: US 11,840,655 B2
(45) Date of Patent: Dec. 12, 2023

(54) YELLOW-RED SPECTRAL QUANTUM DOT, SYNTHESIS METHOD THEREFOR AND APPLICATION THEREOF

(71) Applicant: Najing Technology Corporation Limited, Zhejiang (CN)

(72) Inventors: Xiaopeng Chen, Zhejiang (CN); Lei Shao, Zhejiang (CN); Yangla Xie, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 452 days.

(21) Appl. No.: 17/042,943

(22) PCT Filed: Apr. 22, 2019

(86) PCT No.: PCT/CN2019/083587
§ 371 (c)(1),
(2) Date: Sep. 29, 2020

(87) PCT Pub. No.: WO2019/233201
PCT Pub. Date: Dec. 12, 2019

(65) Prior Publication Data
US 2021/0095206 A1 Apr. 1, 2021

(30) Foreign Application Priority Data
Jun. 4, 2018 (CN) .......................... 201810565762.4

(51) Int. Cl.
*C09K 11/88* (2006.01)
*H10K 50/115* (2023.01)
*B82Y 20/00* (2011.01)
*B82Y 40/00* (2011.01)

(52) U.S. Cl.
CPC ............ *C09K 11/883* (2013.01); *B82Y 20/00* (2013.01); *B82Y 40/00* (2013.01); *H10K 50/115* (2023.02); *C01P 2004/86* (2013.01)

(58) Field of Classification Search
CPC .. C09K 11/883; C01P 2004/86; H10K 50/115
See application file for complete search history.

(56) References Cited

FOREIGN PATENT DOCUMENTS

| | | |
|---|---|---|
| CN | 103154183 A | 6/2013 |
| CN | 104701430 A | 6/2015 |
| CN | 106497546 A | 3/2017 |
| CN | 106574182 A | 4/2017 |
| CN | 107090291 A | 8/2017 |
| CN | 107573923 A | 1/2018 |
| CN | 107903901 A | 4/2018 |
| CN | 108546553 A | 9/2018 |

OTHER PUBLICATIONS

Ping Yang et al.; "CdSe/Cd1-x Zn x S core/shell quantum dots with tunable emission: growth and morphology evolution"; <Journal of Materials Science >; vol. 48; No. 2;Jan. 31, 2013; pp. 651-658.
Ping Yang et al.; "Highly Luminescent CdSe/CdxZn1-xS Quantum Dots with Narrow Spectrum and Widely Tunable Wavelength"; <J. Phys. Chem. C >; vol. 115, No. 30; Jul. 12, 2011; p. 14455-14460.
Himani Sharma. et, al. "Comparison of the properties of composition-tunable CdSe-ZnSe and ZnxCd1-xSe hanocrystallites: Single- and double-pot synthesis approach"; <Materials Chemistry and Physics>; vol. No. 124, No. 1, Nov. 1, 2010,(Nov. 1, 2010); pp. 670-680.

*Primary Examiner* — C Melissa Koslow
(74) *Attorney, Agent, or Firm* — Gang Yu

(57) ABSTRACT

The present disclosure provides a yellow-red spectral quantum dot, a synthesis method therefor and application thereof. The yellow-red spectral quantum dot has an alloyed structure of CdSe@CdZnSe/CdZnS or an alloyed structure of CdSe@CdZnSe/CdZnS/ZnS, the ZnS shell being one or more monolayers, and the fluorescence emission peak wavelength of the yellow-red spectral quantum dot being between 580 nm and 640 nm.

20 Claims, No Drawings

YELLOW-RED SPECTRAL QUANTUM DOT, SYNTHESIS METHOD THEREFOR AND APPLICATION THEREOF

CROSS REFERENCE TO RELATED APPLICATIONS

This application is a national application of PCT/CN2019085026, filed on Apr. 29, 2019. The contents of PCT/CN2019085026 are all hereby incorporated by reference.

TECHNICAL FIELD

The disclosure relates to the technical field of quantum dots synthesis, in particular to a yellow-red spectral quantum dot, a synthesis method therefor and application thereof.

BACKGROUND

Quantum dots (QDs) are semiconductor nanocrystals which are usually between 1 and 100 nm in size and have quantum confinement effect. Due to special optical and optoelectronic properties, such as extremely wide absorption spectrum, very narrow emission spectrum, and high luminous efficiency, electrical and optical properties of quantum dots can be significantly regulated via adjustment of the corresponding band gap of quantum dots by adjusting the size of quantum dots. QDs have a wide range of application prospects in light-emitting or photoelectric conversion components and other components, and have been applied in display, lighting, solar energy, anti-counterfeiting, bioluminescent labels and other fields.

Among them, quantum dot light-emitting diodes (QLEDs) have advantages of low starting voltage, good monochromatic quality, low energy consumption, adjustability of light-emitting color by size of quantum dots, low-cost solution preparation method, and so on, showing huge application potential in the field of display and solid-state lighting. Among the red, green, and blue emissive QLEDs as the three primary color of the light sources, the red emissive QLED has outstanding research results, and may have been able to even come close to commercial applications, mainly because red CdSe/CdS quantum dots with very high optical quality (full width at half maximum below 25 nm, quantum yield more than 90%) and no fluorescence blinking have been obtainable reported in current literature.

For example, based on dropwise addition of mixed precursors of mercaptan and cadmium oleate, Bawendi's research group used S decomposed by mercaptan as well as Cd in cadmium oleate as coating precursors to form homogeneous coating of CdS shell on the surface of CdSe core at a reaction temperature of 310° C., thus obtaining high optical quality CdSe/CdS quantum dots with a thickness of about 7 monolayers of CdS. Further reducing the thickness of shell, Peng's research group used a thickness of only 4 monolayers of CdS to obtain excellent inhibition of fluorescence blinking, and obtained a complete series of red emissive CdSe/CdS quantum dots of 4-16 monolayers at a relatively mild reaction temperature (160-180° C.) through a successive ion layer absorption and reaction technique, abbr. SILAR method, by choosing the amine solution of diethyldithiocarbamate cadmium (II) ($Cd(DDTC)_2$) as a single-molecule precursor, while the external quantum efficiency (EQE) of red quantum dot light-emitting diode (R-QLED) constructed based on such quantum dots was as high as 20.5%, and the lifespan at a brightness of 100 cd $m^{-2}$ reached more than 100,000 hours, capable of meeting the industrial requirements of commercial lighting and display.

However, aforesaid quantum dots used in red QLED have two disadvantages: 1) The synthesis steps are relatively complicated leading to a difficult scale-up, which limits the prospect of large-scale commercial application; 2) Due to the fact that CdS shell is easy to be bleached by light, the stability of quantum dots in the air is relatively poor, so they cannot be directly used to prepare QLED in the air, which greatly increases the requirements for QLED equipment and cost.

In the prior reports, in order to realize the synthesis of photobleaching-resistant and high-air-stability quantum dots, there were two common ways: 1) One-pot method is used to directly synthesize quantum dots with alloy structure, for example, in 2013, Ho et al. used green emissive CdSe@ZnS alloy quantum dots with gradient chemical composition and doped hole transport layer to prepare a QLED with a maximum brightness of 44,000 cd $m^{-2}$ and a maximum current efficiency of 12 cd $A^{-1}$; 2) By introducing a certain thickness of CdS or CdZnS into the shell as a transitional layer, and then coating ZnS on this basis to synthesize multi-shell core-shell quantum dots, such as CdSe/CdS/ZnS quantum dots developed by Talapin's research group, and $CdSe/ZnCd_{0.5}S_{0.5}/ZnS$ quantum dots developed by Peng's research group. Among them, alloy quantum dots have received extensive attention in recent years due to simple synthesis steps, easy scale-up, controllable size and morphology, high optical quality, etc. However, in the alloy quantum dots synthesized in the prior art, the emission wavelengths are mainly focused in the spectral region of 510~540 nm (green spectral region), while there is no relevant report on the alloy quantum dots of high optical quality between 580~640 nm (yellow and red spectral regions).

SUMMARY

The main purpose of the present disclosure is to provide a yellow-red spectral quantum dot, a synthesis method therefor and application thereof, so as to solve the problems that the yellow-red spectral quantum dots are not resistant to photobleaching and have poor air stability in the prior art.

To achieve the aforesaid objectives, according to one aspect of the present disclosure, there is provided a yellow-red spectral quantum dot, wherein the yellow-red spectral quantum dot has an alloyed structure of CdSe@CdZnSe/CdZnS or an alloyed structure of CdSe@CdZnSe/CdZnS/ZnS, the ZnS shell therein being one or more monolayers, and the fluorescence emission peak wavelength of the yellow-red spectral quantum dot being between 580 nm and 640 nm.

Further, the yellow-red spectral quantum dot has a full width at half maximum less than or equal to 25 nm and a quantum yield more than or equal to 85%, and preferably, the number of monolayer of the ZnS shell is 1 to 5.

According to another aspect of the present disclosure, there is provided a synthesis method of yellow-red spectral quantum dot, including: step S1, providing a first solution containing a CdSe quantum dot core; step S2, mixing the first solution with a first cadmium precursor and a first zinc precursor to form a first reaction system, and injecting a selenium precursor to the first reaction system after heating the first reaction system to a first temperature, so as to coat an alloyed CdZnSe shell on the CdSe quantum dot core to obtain a second solution of alloyed CdSe@CdZnSe after purification; step S3, mixing the second solution with a second cadmium precursor and a second zinc precursor to form a second reaction system, and injecting a first sulfur precursor to the second reaction system after heating the second reaction system to a second temperature, so as to coat an alloyed CdZnS shell on the alloyed CdZnSe shell to obtain a third solution of an alloyed CdSe@CdZnSe/CdZnS quantum dot after purification; and optional step S4, mixing the third solution with a third zinc precursor to form a third reaction system, and injecting a second sulfur precursor to the third reaction system after heating the third reaction system to a third temperature, so as to coat a ZnS shell on the alloyed CdZnS shell to obtain alloyed an CdSe@CdZnSe/CdZnS/ZnS quantum dot after purification.

Further, the solvent of the first solution is a first non-coordinating solvent, and the CdSe quantum dot core has a first ligand.

Further, the step S2 includes: providing a first mixed solution containing the first cadmium precursor, the first zinc precursor, and a second ligand, preferably, the solvent of the first mixed solution being a second non-coordinating solvent, preferably the second ligand and the first ligand being the same, and more preferably the second non-coordinating solvent and the first non-coordinating solvent being the same; mixing the first solution with the first mixed solution and heating to 250~320° C., preferably heating to 280~310° C., to form a first reaction system; adding the selenium precursor to the first reaction system, and coating the alloyed CdZnSe shell on the CdSe quantum dot core to obtain a first product system containing a CdSe@CdZnSe.

Further, the step S2 further includes: purifying the first product system to obtain a purified CdSe@CdZnSe alloy quantum dot; dispersing the purified CdSe@CdZnSe alloy quantum dot in a third non-coordinating solvent to obtain a second solution containing a CdSe@CdZnSe, preferably, the third non-coordinating solvent and the first non-coordinating solvent being the same.

Further, the step S3 includes: providing a second mixed solution containing the second cadmium precursor, the second zinc precursor, and a third ligand, preferably the solvent of the second mixed solution being a fourth non-coordinating solvent, preferably the third ligand and the first ligand being the same, and more preferably the fourth non-coordinating solvent and the first non-coordinating solvent being the same; mixing the second solution with the second mixed solution and heating to 250~320° C., preferably heating to 280~310° C., to form a second reaction system; adding the first sulfur precursor to the second reaction system, and coating the alloyed CdZnS shell on the CdSe@CdZnSe under thermal insulation to obtain a second product system containing an alloyed CdSe@CdZnSe/CdZnS.

Further, the step S3 further includes purifying the second product system to obtain a third solution of a purified CdSe@CdZnSe/CdZnS alloy quantum dot.

Further, the step S4 includes: providing a third mixed solution containing the third zinc precursor and a fourth ligand, preferably the solvent of the third mixed solution being a fifth non-coordinating solvent, preferably the fourth ligand and the first ligand being the same, and more preferably the fifth non-coordinating solvent and the first non-coordinating solvent being the same; mixing the second solution and the third mixed solution and heating to 250~320° C., preferably heating to 280~310° C., to form a third reaction system; adding the second sulfur precursor to the third reaction system, and coating the ZnS shell on the CdSe@CdZnSe/CdZnS under thermal insulation to obtain a third product system containing a CdSe@CdZnSe/CdZnS/ZnS quantum dot.

Further, the step S4 further includes purifying the third product system to obtain a purified CdSe@CdZnSe/CdZnS/ZnS alloy quantum dot.

Further, in the step S2, a molar ratio of the CdSe quantum dot core with respect to the first cadmium precursor with respect to the first zinc precursor is $1:2*10^3:2*10^4$~$1:2*10^4:2*10^5$, and a molar ratio of the CdSe quantum dot core with respect to the selenium precursor is $1:5*10^3$~$1:5*10^4$; preferably, in the step S3, a molar ratio of the CdSe quantum dot core with respect to the second cadmium precursor with respect to the second zinc precursor is $1:2*10^3:2*10^4$~$1:2*10^4:2*10^5$, and a molar ratio of the CdSe quantum dot core with respect to the first sulfur precursor is $1:2*10^4$~$1:2*10^5$; preferably, in the step S4, a molar ratio of the CdSe quantum dot core with respect to the third zinc precursor is $1:5*10^4$~$1:5*10^5$, and a molar ratio of the CdSe quantum dot core with respect to the second sulfur precursor is $1:0$~$1:2*10^5$.

Further, the first cadmium precursor and the second cadmium precursor are each independently selected from any one of cadmium carboxylates with a carbon chain length of 8 to 22, preferably selected from any one of cadmium carboxylates with a carbon chain length of 8 to 18; and the first zinc precursor, the second zinc precursor, and the third zinc precursor are each independently selected from any one of zinc carboxylates with a carbon chain length of 8 to 22, preferably selected from any one of zinc carboxylates with a carbon chain length of 8 to 18; preferably, the selenium precursor is one of a non-coordinating solution of selenium and a trialkylphosphine solution of selenium, preferably any one of a tributylphosphine solution of selenium and a trioctylphosphine solution of selenium; the first sulfur precursor and the second sulfur precursor are each independently one of a non-coordinating solution of sulfur and a trialkylphosphine solution of sulfur, preferably any one of a tributylphosphine solution of sulfur and a trioctylphosphine solution of sulfur.

According to another aspect of the present disclosure, there is provided a QLED device, including a quantum dot layer including a quantum dot, wherein the quantum dot is any one of aforesaid yellow-red spectral quantum dot, or the quantum dot is the yellow-red spectral quantum dot prepared by any one of aforesaid method.

According to another aspect of the present disclosure, there is provided a preparation process of aforesaid QLED device, wherein the preparation process is performed in an air atmosphere.

According to another aspect of the present disclosure, there is provided a quantum dot composition, including a yellow-red spectral quantum dot, wherein the yellow-red spectral quantum dot is any one of aforesaid yellow-red spectral quantum dot, or the yellow-red spectral quantum dot is the yellow-red spectral quantum dot prepared by any one of aforesaid method.

Applying the technical scheme of the present disclosure, due to the alloyed structure of the yellow-red spectral quantum dot of the present application, the yellow-red spectral quantum dot is resistant to photobleaching and has good air stability. Meanwhile, the fluorescence emission peak wavelength may be achieved by means of adjusting the ratio of Cd, Zn and Se.

DETAILED DESCRIPTION

It should be noted that the embodiments of the present disclosure and the features of the embodiments may be combined with each other in case of no conflict. The disclosure will be described in detail below with reference to the figures and in conjunction with the embodiments.

As used herein, the singular forms "a", "an" and "the" are intended to include the plural forms as well, unless the context clearly indicates otherwise.

In this application, the terms "CdSe@CdZnSe" used mean forming an alloy-like CdZnSe quantum dot core and containing CdSe to some extent in the most central part of the aforesaid core.

It should be noted that the core and the shell may have an interface, and an element of at least one of the core or the shell in the interface may have a concentration gradient wherein the concentration of the element(s) of the shell decreases toward the core. The shell and the adjacent shell may have an interface, and the interface may include an element of at least one of the two shells As analyzed in the background of the present application, the yellow-red spectral quantum dots in the prior art are not resistant to photobleaching and have poor air stability. To solve this problem, the present application provides a yellow-red spectral quantum dot, with an alloyed structure of CdSe@CdZnSe/CdZnS or with an alloyed structure of CdSe@CdZnSe/CdZnS/ZnS, the ZnS shell being one or more monolayers, and the fluorescence emission peak wavelength of the yellow-red spectral quantum dot being between 580 nm and 640 nm.

Due to the alloyed structure of the yellow-red spectral quantum dot of the present application, the yellow-red spectral quantum dot has photobleaching resistance and good air stability. Meanwhile, the aforesaid fluorescence emission peak wavelength can be realized by adjusting the ratio of Cd, Zn and Se.

In some embodiments, the full width at half maximum of the yellow-red spectral quantum dot is less than or equal to 25 nm, and the quantum yield is more than or equal to 85%. Since ZnSe and CdSe have a high lattice match and are easy to be alloyed during the synthesis process, the yellow-red spectral quantum dot formed thereby has a relative perfect alloyed structure of CdSe@CdZnSe/CdZnS, which ensures that, in the coating processes of CdZnSe and CdZnS, the size distribution of the quantum dot can be maintained at the level of single exponential dispersion (known in the industry: generally, the full width at half maximum may be maintained between 19 nm and 22 nm for the emission spectrum of a single quantum dot, thus when the full width at half maximum of a quantum dots solution can be below 25 nm, it is considered that the quantum dots in the quantum dots solution exhibit a single exponential dispersion), and finally high optical quality (quantum yield above 90%, full width at half maximum below 25 nm) quantum dot having CdSe@CdZnSe/CdZnS structure can be obtained. In addition, inventors' researches have shown that the yellow-red spectral quantum dot disclosed in this application has high adjustability of the emission wavelength, high photobleaching resistance and air stability, and achievability of a kilogram-level industrial production of the quantum dot. Furthermore, the red emissive QLED devices prepared on the quantum dot basis have an EQE of more than or equal to 10%, and a lifespan of more than or equal to 10,000 hours at a brightness of 100 cd m$^{-2}$ (the minimum commercialization requirement), which can meet the needs of commercial application, and the quantum dot can meet the needs of preparing devices in the air by printing technique, greatly reducing the equipment requirements for preparation of red emissive QLED and preparation costs, with a wide range of commercial application prospects. In some embodiments, the number of monolayer of ZnS shell is 1 to 5.

In another exemplary embodiment of the present application, a synthesis method of the yellow-red spectral quantum dot is provided, the synthesis method includes: step S1, providing a first solution containing CdSe quantum dot core; step S2, mixing the first solution with a first cadmium precursor and a first zinc precursor to form a first reaction system, and injecting a selenium precursor to the first reaction system after heating the first reaction system to a first temperature, so as to coat an alloyed CdZnSe shell on the CdSe quantum dot core to obtain a second solution of an alloyed CdSe@CdZnSe after purification; step S3, mixing the second solution with a second cadmium precursor and a second zinc precursor to form a second reaction system, and injecting a first sulfur precursor to the second reaction system after heating the second reaction system to a second temperature, so as to coat an alloyed CdZnS shell on the alloyed CdZnSe shell to obtain a third solution of an alloyed CdSe@CdZnSe/CdZnS quantum dot after purification; and optional step S4, mixing the third solution with a third zinc precursor to form a third reaction system, and injecting a second sulfur precursor to the third reaction system after heating the third reaction system to a third temperature, so as to coat a ZnS shell on the alloyed CdZnS shell to obtain an alloyed CdSe@CdZnSe/CdZnS/ZnS quantum dot after purification.

Since ZnSe and CdSe have a high lattice match and are easy to be alloyed during the synthesis process, the yellow-red spectral quantum dot formed thereby have a relative perfect alloyed structure of CdSe@CdZnSe/CdZnS, which ensures that, in the coating processes of CdZnSe and CdZnS, the size distribution of the quantum dot can be maintained at the level of single exponential dispersion; meanwhile, the ratio of Cd, Zn and Se can be adjusted by the amount of raw materials used in the synthesis process to realize the adjustment of the emission peak wavelength, finally thus obtaining high optical quality yellow-red spectral quantum dot with the structure of CdSe@CdZnSe/CdZnS or alloyed CdSe@CdZnSe/CdZnS/ZnS.

On the basis of sufficient dispersion of CdSe quantum dot core, in order to avoid affecting the structure of CdSe quantum dot core, in some embodiments, the solvent of the first solution is a first non-coordinating solvent, and CdSe quantum dot core has a first ligand, so as to further ensure the stability of CdSe quantum dot core in subsequent reactions. In some embodiments, the aforesaid first ligand may be selected from any one or more of a saturated fatty acid and an unsaturated fatty acid. In some embodiments, the fatty acid is selected from fatty acid with a carbon chain length of 8 to 22. In some embodiments, the fatty acid is preferably but not limited to selected from any one or more of lauric acid, myristic acid, stearic acid and oleic acid.

In one or more embodiments of the present application, the aforesaid step S2 includes: providing a first mixed solution containing a first cadmium precursor, a first zinc precursor, and a second ligand; mixing the first solution with the first mixed solution and heating to 250~320° C. to form a first reaction system; adding a selenium precursor to the first reaction system, and coating the alloyed CdZnSe shell on the CdSe quantum dot core to obtain a first product system containing CdSe@CdZnSe. In some embodiments, the solvent of the first mixed solution is a second non-coordinating solvent. In some embodiments, the second ligand and the first ligand are the same. In some embodiments, the second non-coordinating solvent and the first non-coordinating solvent are the same. In some embodiments, heating to 280~310° C. to form the first reaction system.

In some embodiments, all of other precursors are mixed and subsequently mixed with the CdSe quantum dot core to form a uniformly dispersed system before the selenium precursor is added, and then mixed with the selenium precursor at a corresponding reaction temperature for coating reaction for alloying, thereby obtaining a uniformly coated structure.

In order to improve the coating effectiveness and coating uniformity of the CdZnS shell, in some embodiments, the aforesaid step S2 further includes: purifying the first product system to obtain a purified CdSe@CdZnSe alloy quantum dot; dispersing the purified CdSe@CdZnSe alloy quantum dot in a third non-coordinating solvent to obtain a second solution containing a CdSe@CdZnSe. In some embodiments, the third non-coordinating solvent and the first non-coordinating solvent are the same.

In one or more embodiments of the present application, the aforesaid step S3 includes: providing a second mixed solution containing a second cadmium precursor, a second zinc precursor, and a third ligand; mixing the second solution with the second mixed solution and heating to 250~320° C. to form a second reaction system; adding a first sulfur precursor to the second reaction system, coating the alloyed CdZnS shell on the CdSe@CdZnSe under thermal insulation to obtain a second product system containing an alloyed CdSe@CdZnSe/CdZnS. In some embodiments, the solvent of the second mixed solution is a fourth non-coordinating solvent. In some embodiments, the third ligand and the first ligand are the same. In some embodiments, the fourth non-coordinating solvent and the first non-coordinating solvent are the same. In some embodiments, heating to 280~310° C. to form the second reaction system.

In some embodiments, all of other precursors are mixed and subsequently mixed with CdSe@CdZnSe to form a uniformly dispersed system before the first sulfur precursor is added, and then mixed with the first sulfur precursor at a corresponding reaction temperature for coating reaction for alloying, thereby obtaining a uniformly coated structure.

In some embodiments, in order to improve the long-term stability of the obtained alloy quantum dot and achieve excellent optical performances, the aforesaid step S3 further includes purifying the second product system to obtain a third solution of a purified CdSe@CdZnSe/CdZnS alloy quantum dot.

In one or more embodiments of the present application, the aforesaid step S4 includes: providing a third mixed solution containing a third zinc precursor and a fourth ligand; mixing the second solution and the third mixed solution and heating to 250~320° C. to form a third reaction system; adding a second sulfur precursor to said third reaction system, coating the ZnS shell on CdSe@CdZnSe/CdZnS under thermal insulation to obtain a third product system containing a CdSe@CdZnSe/CdZnS/ZnS quantum dot. In some embodiments, the solvent of the third mixed solution is a fifth non-coordinating solvent. In some embodiments, the fourth ligand and the first ligand are the same. In some embodiments, the fifth non-coordinating solvent and the first non-coordinating solvent are the same. In some embodiments, heating to 280~310° C. to form the third reaction system.

In some embodiments, the aforesaid step S4 further includes purifying said third product system to obtain a purified CdSe@CdZnSe/CdZnS/ZnS alloy quantum dot, so as to improve the storage stability of the CdSe@CdZnSe/CdZnS/ZnS alloy quantum dot.

In order to increase the quantum yield of yellow-red spectral quantum dots with a fluorescence emission peak wavelength of 580 nm~640 nm, in some embodiments, in the step S2, the molar ratio of the CdSe quantum dot core with respect to the first cadmium precursor with respect to the first zinc precursor is $1:2*10^3:2*10^4$~$1:2*10^4:2*10^5$, and the molar ratio of the CdSe quantum dot core with respect to selenium precursor is $1:5*10^3$~$1:5*10^4$; In some embodiments, in the step S3, the molar ratio of the CdSe quantum dot core with respect to the second cadmium precursor with respect to the second zinc precursor is $1:2*10^3:2*10^4$~$1:2*10^4:2*10^5$, and the molar ratio of the CdSe quantum dot core with respect to said first sulfur precursor is $1:2*10^4$~$1:2*10^5$; In some embodiments, in the step S4, the molar ratio of the CdSe quantum dot core with respect to the third zinc precursor is $1:5*10^4$~$1:5*10^5$, and the molar ratio of the CdSe quantum dot core with respect to the second sulfur precursor is $1:0$~$1:2*10^5$.

The first cadmium precursor, the second cadmium precursor, the first zinc precursor, the second zinc precursor, the third zinc precursor, the first sulfur precursor, the second sulfur precursor, and the selenium precursor used in the present application can be selected from the precursors commonly used in the synthesis of quantum dots in the prior art. In order to further increase the yield of the target quantum dot, in some embodiments, the first cadmium precursor and the second cadmium precursor are each independently selected from any one of cadmium carboxylates with a carbon chain length of 8 to 22, preferably but not limited to selected from any one of cadmium carboxylates with a carbon chain length of 8 to 18, and the first zinc precursor, the second zinc precursor, and the third zinc precursor are each independently selected from any one of zinc carboxylates with a carbon chain length of 8 to 22, preferably but not limited to selected from any one of zinc carboxylates with a carbon chain length of 8 to 18. In some embodiments, the selenium precursor is one of a non-coordinating solution of selenium and a trialkylphosphine solution of selenium, the selenium precursor is preferably but not limited to any one of a tributylphosphine solution of selenium and a trioctylphosphine solution of selenium. In some embodiments, the first sulfur precursor and the second sulfur precursor are each independently a non-coordinating solution of sulfur or a trialkylphosphine solution of sulfur, preferably but not limited to any one of a tributylphosphine solution of sulfur and a trioctylphosphine solution of sulfur.

In yet another exemplary embodiment of the present application, there is provided a QLED device, including a quantum dot layer including a quantum dot which is any of the aforesaid yellow-red spectral quantum dot, or the yellow-red spectral quantum dot prepared by any of the aforesaid synthesis method. The EQE of QLED device with the yellow-red spectral quantum dot of the present application is more than or equal to 10%, and the lifespan at a brightness of 100 cd m$^{-2}$ is more than or equal to 10,000 hours.

In yet another exemplary embodiment of the present application, there is provided a preparation process of the aforesaid QLED device, and the preparation process is performed in an air atmosphere.

Since the yellow-red spectral quantum dot of the present application has high air stability, the preparation process of the aforesaid QLED device can be carried out in an air atmosphere without creating a nitrogen or inert gas environment in advance, thereby greatly reducing the equipment requirements for preparation of R-QLEDs and preparation costs, with a wide range of commercial application prospects.

In yet another exemplary embodiment of the present application, there is provided a quantum dot composition, including a yellow-red spectral quantum dot, which is any one of the aforesaid yellow-red spectral quantum dot, or the yellow-red spectral quantum dot prepared by any of the aforesaid synthesis method. Due to the high optical quality of the yellow-red spectral quantum dot of the present application, the application range of the quantum dot composition can be expanded.

The beneficial effects of the present application will be further described below in conjunction with embodiments and comparative embodiments.

Synthesis of the CdSe Quantum Dot Cores

1) Successively weigh 0.533 g (i.e. 2 mmol) of $CdAc_2 \cdot 2H_2O$, 2.28 g (i.e. 8 mmol) of oleic acid (OA), and 12 g of octadecene (ODE) to place in a 100 mL three-necked flask, put a magnetic stir bar into the three-necked flask, vent the air with nitrogen, and raise the temperature of the system in the three-necked flask to 170° C., and stir the system by use of the magnetic stir bar at 60 rpm/min.

2) Weigh 79 mg of selenium powder (i.e. Se, 1 mmol) and add 2 mL of ODE, disperse for 2 minutes by ultrasonic treatment to obtain Se-ODE.

3) After deoxygenating the system in the three-necked flask, raise the temperature of the system to 250° C., and then quickly inject 1 mL Se-ODE for reaction at 240° C., with LTV detection, and after 15 minutes of reaction, the ultraviolet absorption wavelength of the first exciton peak of the CdSe quantum dot cores was 512 nm;

4) 0.1 mL of 0.5M Se-ODE was added by drops every time at an interval of 10 min, during which sample monitoring was performed at 5 minutes after each addition, and the reaction was stopped after the UV first exciton peak wavelength reached the target position. According to this method, the CdSe quantum dot cores with the first exciton peak wavelength between 520 nm and 560 nm can be synthesized for the synthesis of yellow-red spectral quantum dots of each embodiment.

Purification:

5) Pour the prepared product system containing the CdSe quantum dot cores into a separatory funnel, successively add 20 mL of n-hexane and 70 mL of methanol and mix well to remove the lower methanol, repeat the above process for 2 to 3 times, until 10 to 15 mL of the upper solution where the CdSe quantum dot cores were located was obtained;

6) Transfer the upper solution containing the CdSe quantum dot cores to a centrifuge tube and add 30-40 mL of acetone and mix well, discard the upper liquid solution after centrifugation at 4900 rpm for 3 minutes, and dissolve the solid precipitation with ODE to obtain an ODE solution;

7) Centrifuge the aforesaid ODE solution at 4900 rpm for 3 minutes, take the clear solution to measure the first exciton peak and Optical Density (OD) for later use.

Embodiment 1

Synthesis of 580 nm CdSe@CdZnSe/CdZnS quantum dots (1) Coating of CdZnSe Shell:

1) Successively weigh 26.6 mg (i.e. 0.1 mmol) of $CdAc_2 \cdot 2H_2O$, 0.183 g (i.e. 1 mmol) of zinc acetate, 1.12 g (i.e. 4 mmol) of oleic acid (OA), and ODE to place in a 100 mL three-necked flask, put a magnetic stir bar into the three-necked flask, vent the air with nitrogen, and raise the temperature of the system in the three-necked flask to 160° C., and stir the system by use of the magnetic stir bar at 60 rpm/min with concurrent venting of the air and acetic acid with nitrogen for at least 0.5 hours.

2) Weigh 20 mg of Se powder (i.e. 0.25 mmol) and add 0.5 mL of TOP for ultrasonic dissolution to obtain a Se-TOP solution.

3) After deoxygenating the system of the three-necked flask, raise the temperature of the system to 305° C., and add the CdSe quantum dot cores (UV=525 nm, OD=50, the quantity of 25 nmol);

4). Inject the Se-TOP solution into the three-necked flask, and react for 20 minutes, with sample monitoring of Photo luminescence (PL) and full width at half maximum every 5 minutes, and finally obtain CdSe@CdZnSe with a PL of 575 nm and a full width at half maximum of 19 nm.

5). Remove the heat source, reduce the temperature of the system below 100° C., and cool to obtain a product system containing CdSe@CdZnSe.

Purification:

6) Transfer the product system containing CdSe@CdZnSe to a 50 mL centrifuge tube and add 30 mL of acetone and mix well, discard the upper liquid solution after centrifugation at 4900 rpm for 3 minutes, dry the solid, and dissolve the dried solid with ODE to obtain an ODE solution containing CdSe@CdZnSe;

7) Centrifuge the ODE solution containing CdSe@CdZnSe at 4900 rpm for 3 minutes, and take the upper ODE solution for later use.

(2) Coating of CdZnS Shell:

1) Successively weigh 26.6 mg (i.e. 0.1 mmol) of $CdAc_2 \cdot 2H_2O$, 0.183 g (i.e. 1 mmol) of $ZnAc_2$, 1.12 g (i.e. 4 mmol) of OA, and ODE to place in a 100 mL three-necked flask, put a magnetic stir bar into the three-necked flask, vent the air with nitrogen, and raise the temperature of the system in the three-necked flask to 160° C., and stir the system by use of the magnetic stir bar at 60 rpm/min with concurrent venting of the air and acetic acid with nitrogen for at least 0.5 hours.

2) Weigh 32 mg of S powder (i.e. 1 mmol) and add 2 mL of TBP for ultrasonic dissolution to obtain a S-TBP solution.

3) After deoxygenating the system in the three-necked flask, raise the temperature of the system to 305° C., and add the aforesaid synthesized CdSe/CdZnSe quantum dots;

4) Inject the S-TBP solution into the three-necked flask, and react for 20 minutes, with sample monitoring of PL and full width at half maximum every 5 minutes, and finally obtain alloyed CdSe@CdZnSe/CdZnS with a PL of 580 nm, a full width at half maximum of 19 nm and a QY (quantum yield) of 96.3%.

5) Remove the heat source, reduce the temperature of the system below 100° C., and cool to obtain a product system containing alloyed CdSe@CdZnSe/CdZnS.

Purification:

6) Transfer the prepared product system containing alloyed CdSe@CdZnSe/CdZnS to a 50 mL centrifuge tube and add 30 mL of acetone for good mixing, discard the liquid solution after centrifugation at 4900 rpm for 3 minutes, dry the solid, and dissolve the dried solid with toluene to obtain a toluene solution containing alloyed CdSe@CdZnSe/CdZnS;

7) Centrifuge the toluene solution containing alloyed CdSe@CdZnSe/CdZnS at 4900 rpm for 3 minutes, and take the upper toluene solution to measure the OD value at $LTV_{450}$, being saved for later use.

Embodiment 2

Synthesis of 590 nm CdSe@CdZnSe/CdZnS quantum dots

The operating procedure and quantities are the same as in Embodiment 1, except that the following quantities have been changed:
(1) Coating of CdZnSe Shell:
CdSe@CdZnSe quantum dots with a PL of 586 nm and a full width at half maximum of 20 nm were finally obtained under the following condition: the quantity of $CdAc_2 \cdot 2H_2O$ was unchanged, the quantity of $ZnAc_2$ was increased to 5 mmol, the quantity of OA was increased to 16 mmol, and the quantity of Se was adjusted to 0.125 mmol.
(2) Coating of CdZnS Shell:
Quantum dots with alloyed CdSe@CdZnSe/CdZnS with a PL of 590.5 nm, a full width at half maximum of 21 nm and a QY of 92.5% are finally obtained under the following condition: the quantity of $CdAc_2 \cdot 2H_2O$ unchanged, the quantity of $ZnAc_2$ increased to 5 mmol, the quantity of OA increased to 16 mmol, and the quantity of S adjusted to 0.5 mmol.

Embodiment 3

Synthesis of 610 nm CdSe@CdZnSe/CdZnS Quantum Dots

The operating procedure and quantities are the same as in Embodiment 1, except that the following quantities have been changed:
(1) Coating of CdZnSe Shell:
Change the CdSe quantum dot cores to the LTV wavelength=550 nm, OD=50, and the quantity of 25 nmol; CdSe@CdZnSe quantum dots with a PL of 608.5 nm and a full width at half maximum of 21 nm were finally obtained under the following condition: the quantity of $CdAc_2 \cdot 2H_2O$ unchanged, the quantity of $ZnAc_2$ increased to 2 mmol, the quantity of OA increased to 8 mmol, and the quantity of Se adjusted to 1.25 mmol.
(2) Coating of CdZnS Shell:
Quantum dots containing alloyed CdSe@CdZnSe/CdZnS with a PL of 611.5 nm, a full width at half maximum of 21 nm and a QY of 93.8% were finally obtained under the following condition: the quantity of $CdAc_2 \cdot 2H_2O$ unchanged, the quantity of $ZnAc_2$ increased to 2 mmol, the quantity of OA increased to 8 mmol, and the quantity of S adjusted to 0.125 mmol.

Embodiment 4

Synthesis of 630 nm CdSe@CdZnSe/CdZnS Quantum Dots

The operating procedure and quantities are the same as in Embodiment 1, except that the following quantities have been changed:
(1) Coating of CdZnSe Shell:
Change the CdSe quantum dot cores to the LTV wavelength=560 nm, OD=50, and the quantity of 25 nmol; CdSe@CdZnSe quantum dots with a PL of 626.5 nm and a full width at half maximum of 21 nm were finally obtained under the following condition: the quantity of $CdAc_2 \cdot 2H_2O$ unchanged, the quantity of $ZnAc_2$ increased to 5 mmol, and the quantity of OA increased to 16 mmol.
(2) Coating of CdZnS Shell:
Quantum dots containing alloyed CdSe@CdZnSe/CdZnS with a PL of 629.5 nm, a full width at half maximum of 22 nm and a QY of 94.2% were finally obtained under the following condition: the quantity of $CdAc_2 \cdot 2H_2O$ unchanged, the quantity of $ZnAc_2$ increased to 5 mmol, the quantity of OA increased to 16 mmol, and the quantity of S adjusted to 5 mmol.

Embodiment 5

Synthesis of 620 nm CdSe@CdZnSe/CdZnS Quantum Dots

The operating procedure and quantities are the same as in Embodiment 1, except that the following quantities have been changed:
(1) Coating of CdZnSe Shell:
CdSe@CdZnSe quantum dots with a PL of 615 nm and a full width at half maximum of 23 nm were finally obtained under the following condition: the quantity of $CdAc_2 \cdot 2H_2O$ changed to 0.5 mmol and the quantity of $ZnAc_2$ unchanged.
(2) Coating of CdZnS Shell:
Quantum dots containing alloyed CdSe@CdZnSe/CdZnS with a PL of 621.5 nm, a full width at half maximum of 24 nm and a QY of 90.6% were finally obtained under the following condition: the quantity of $CdAc_2 \cdot 2H_2O$ changed to 0.5 mmol and the quantity of $ZnAc_2$ unchanged.

Embodiment 6

Synthesis of 615 nm CdSe@CdZnSe/CdZnS/ZnS Quantum Dots

The operating procedure and quantities of CdSe@CdZnSe/CdZnS are the same as in Embodiment 5, except that coating of ZnS shell is added:
(3) Coating of ZnS Shell:
1) Successively weigh 0.183 g (i.e. 1 mmol) of zinc acetate, 1.12 g (i.e. 4 mmol) of OA, and ODE to place in a 100 mL three-necked flask, put a magnetic stir bar into the three-necked flask, vent the air with nitrogen, and raise the temperature of the system in the three-necked flask to 160° C., and stir the system by use of the magnetic stir bar at 60 rpm/min with concurrent venting of the air and acetic acid with nitrogen for at least 0.5 hours.
2) Weigh 8 mg of S powder (i.e. 0.25 mmol) and add 0.5 mL of TOP for ultrasonic dissolution to obtain a S-TOP solution.
3) After deoxygenating the system in the three-necked flask, raise the temperature of the system to 305° C., and add the CdSe@CdZnSe/CdZnS quantum dots synthesized in step 2);
4) Inject the S-TOP solution into the three-necked flask, and react for 20 minutes, with sample monitoring of PL and full width at half maximum every 5 minutes, and finally obtain CdSe@CdZnSe/CdZnS/ZnS quantum dots with a PL of 615 nm, a full width at half maximum of 24 nm and a QY of 92.6%, wherein, there was a thickness of 3 monolayers of ZnS shell.

Comparative Embodiment 1

Synthesis of CdSe@ZnSe/CdZnS Quantum Dots

The operating procedure and quantities are the same as in Embodiment 1, except that the following quantities have been changed:

(1) Coating of ZnSe Shell:

CdSe@ZnSe quantum dots with a PL of 565 nm and a full width at half maximum of 26 nm were finally obtained under the following condition: no addition of $CdAc_2 \cdot 2H_2O$ and the quantity of $ZnAc_2$ unchanged.

(2) Coating of CdZnS Shell:

Quantum dots with alloyed CdSe@ZnSe/CdZnS with a PL of 572.5 nm, a full width at half maximum of 28 nm and a QY of 79.6% were finally obtained.

Comparative Embodiment 2

Synthesis of CdSe/CdZnS Quantum Dots

CdSe/CdZnS quantum dots with a PL of 578 nm, a full width at half maximum of 32 nm and a QY of 73.6% were finally obtained under the following condition: no coating of CdZnSe alloy shell and direct coating of CdZnS.

Embodiment 7

QLED Based on 630 nm CdSe@CdZnSe/CdZnS Quantum Dots of Embodiment

According to a method of a literature (X. Dai, et al., Solution-processed, high-performance light-emitting diodes based on quantum dots, Nature 515, 96 (2014). doi:10.1038/nature13829), CdSe@CdZnSe/CdZnS quantum dots with a wavelength of 630 nm were selected for the preparation of QLED device. The whole process was carried out in air atmosphere. The specific operation steps were as follows: spin-coating PEDOT:PSS solution (BaytronPVPAl 4083, filtered through 0.45 mm N66 filter paper) on a glass substrate with ITO coating at 4000 rpm within 1 minute, followed by baking at 140° C. for 10 minutes, and then successively spin-coating chlorobenzene solution of PVK, CdSe@CdZnSe/CdZnS quantum dot solution, and ethanol solution of nanoparticles ZnO at 2000 rpm within 45 seconds. Subsequently, depositing a 100 nm Ag layer by vacuum evaporation method, finally the device was enclosed in organic glass by ultraviolet curing resin. The layer of CdSe@CdZnSe/CdZnS quantum dots was about 40 nm. After testing, the QLED prepared in air based on CdSe@CdZnSe/CdZnS quantum dots has an external quantum efficiency (EQE) of ~18%, and a lifespan of more than or equal to 100,000 hours at a brightness of 100 cd m$^{-2}$, which reached the same level as stated in the literature.

Comparative Embodiment 3

QLED Based on CdSe/CdZnS Quantum Dots of Comparative Embodiment 2

The difference from Embodiment 7 is that the CdSe/CdZnS quantum dots of Comparative Embodiment 2 were used to prepare QLED device. After testing, the QLED prepared in air based on CdSe/CdZnS quantum dots has an external quantum efficiency (EQE) of ~5%, and a lifespan of ~100 hours at a brightness of 100 cd m$^{-2}$, indicating that the quantum dots of the CdSe/CdZnS structure could not meet the requirements for preparation of QLED based on the air process.

Comparative Embodiment 4

QLED Based on CdSe/CdS Quantum dots Reported in the Literature

The difference from Embodiment 7 is that 630 nm CdSe/CdS quantum dots synthesized according to the method of the literature (X. Dai, et al., Solution-processed, high-performance light-emitting diodes based on quantum dots, Nature 515, 96 (2014). doi:10.1038/nature13829) were used for the preparation of QLED device. After testing, the QLED prepared in air based on CdSe/CdS quantum dots has an external quantum efficiency (EQE) of ~10%, and a lifespan of <1000 hours at a brightness of 100 cd m$^{-2}$, indicating that the quantum dots of the CdSe/CdS structure could not meet the requirements for preparation of QLED based on the air process, despite of the excellent results of the device prepared under nitrogen atmosphere reported in the literature (EQE~20%, a lifespan of >100,000 hours at a brightness of 100 cd m$^{-2}$).

From the above descriptions, it can be seen that the aforesaid embodiments of the present disclosure achieve the following technical effects:

Due to the alloyed structure of the yellow-red spectral quantum dot of the present application, the yellow-red spectral quantum dot has photobleaching resistance and good air stability. Meanwhile, the aforesaid fluorescence emission peak wavelength can be realized by adjusting the ratio of Cd, Zn and Se. The quantum dot electroluminescent device using the quantum dot can be prepared in air without nitrogen atmosphere, which can greatly reduce the process cost.

Since ZnSe and CdSe have a high lattice match and are easy to be alloyed during the synthesis process, the yellow-red spectral quantum dot formed thereby has a relative perfect alloyed structure of CdSe@CdZnSe/CdZnS which ensures that, in the coating processes of CdZnSe and CdZnS, the size distribution of the quantum dot can be maintained at the level of single exponential dispersion; meanwhile, the ratio of Cd, Zn and Se can be adjusted by the amount of raw materials used in the synthesis process to realize the adjustment of the emission peak wavelength, finally obtaining high optical quality yellow-red spectral quantum dot with the structure of CdSe@CdZnSe/CdZnS or alloyed CdSe@CdZnSe/CdZnS/ZnS.

The foregoing descriptions are merely preferred embodiments of the present disclosure and are not intended to limit the present disclosure, and for those skilled in the art, the present disclosure may have various changes and modifications. Any modification, equivalent replacement, and improvement made in the spirit and principle of the present disclosure shall fall within the protection scope of the present disclosure.

What is claimed is:

1. A yellow-red spectral quantum dot, wherein said yellow-red spectral quantum dot has an alloyed structure of CdSe@CdZnSe/CdZnS or an alloyed structure of CdSe@CdZnSe/CdZnS/ZnS, said ZnS shell being one or more monolayers, and a fluorescence emission peak wavelength of said yellow-red spectral quantum dot being between 580 nm and 640 nm.

2. The yellow-red spectral quantum dot according to claim 1, wherein said yellow-red spectral quantum dot has a full width at half maximum less than or equal to 25 nm and a quantum yield more than or equal to 85%.

3. The yellow-red spectral quantum dot according to claim 1, wherein a number of monolayer of said ZnS shell is 1 to 5.

4. A synthesis method of yellow-red spectral quantum dot, wherein comprising:

step S1, providing a first solution containing a CdSe quantum core;

step S2, mixing said first solution with a cadmium precursor and a first zinc precursor to form a first reaction system, and injecting a selenium precursor to said first reaction system after heating said first reaction system to a first temperature, so as to coat an alloyed CdZnSe shell on said CdSe quantum dot core, purifying to obtain a second solution and an alloyed CdSe@CdZnSe, said first temperature is 250-320° C.;

step S3, mixing said second solution with a second cadmium precursor and a second zinc precursor to form a second reaction system, injecting a first sulfur precursor to said second reaction system after heating said second reaction system to a second temperature, so as to coat an alloyed CdZnS shell on said alloyed CdZnSe shell, purifying to obtain a third solution of an alloyed CdSe@CdZnSe/CdZnS quantum dot.

5. The synthesis method according to claim 4, wherein a solvent of said first solution is a first non-coordinating solvent, and said CdSe quantum dot core has a first ligand.

6. The synthesis method according to claim 4, wherein said step S2 comprising:
providing a first mixed solution containing said first cadmium precursor, said first zinc precursor and a second ligand;
mixing said first solution with said first mixed solution and heating to 250~320° C., to form said first reaction system;
adding said selenium precursor to said first reaction system, and coating said alloyed CdZnSe shell on said CdSe quantum dot core to obtain a first product system containing CdSe@CdZnSe.

7. The synthesis method according to claim 4, wherein step S2 further comprises:
purifying said first product to obtain a purified CdSe@CdZnSe alloy quantum dot;
dispersing said purified CdSe@CdZnSe alloy quantum dot in a third non-coordinating solvent to obtain said second solution comprising CdSe@CdZnSe.

8. The synthesis method according to claim 4, wherein said step S3 comprising:
providing a second mixed solution containing said second cadmium precursor, second first zinc precursor and a third ligand;
mixing said second solution with said second mixed solution and heating to 250~320° C., preferably heating to 280~310° C., to form said second reaction system;
adding said first sulfur precursor to said second reaction system, and coating said alloyed CdZnSe shell on said CdSe@CdZnSe under thermal insulation to obtain a second product system containing alloyed CdSe@CdZnSe/CdZnS.

9. The synthesis method according to claim 8, wherein step S3 further comprises purifying said second product system to obtain said third solution of a purified CdSe@CdZnSe/CdZnS alloy quantum dot.

10. The synthesis method according to 3, further comprises step S4 wherein said step S4 comprising:
proving a third mixed solution containing a third zinc precursor and a fourth ligand;
mixing said second solution and said third mixed solution and heating to 250~320° C., to form a third reaction system;
adding said second sulfur precursor to said third reaction mixture, and coating said ZnS shell on said CdSe@CdZnSe/CdZnS under thermal insulation to obtain a third product system containing a CdSe@CdZnSe/CdZnS/ZnS quantum dot.

11. The synthesis method according to claim 10, wherein said step S4 further comprises purifying said third product system to obtain a purified CdSe@CdZnSe/CdZnS/ZnS alloy quantum dot.

12. The synthesis method according to claim 10, wherein comprising:
Step 4S, mixing said third solution with a third zinc precursor to form a third reaction system, and injecting a second sulfur precursor to said third reaction system after heating said third reaction system to a third temperature, so as to coat a ZnS shell on said alloyed CdZnS shell, purifying to obtain an alloyed CdSe@CdZnSe/CdZnS/ZnS quantum dot.

13. The synthesis method of claim 12, wherein said second sulfur precursor is one of a non-coordinating solution of sulfur and a trialkylphosphine solution of sulfur.

14. The synthesis method according to claim 4, wherein in said step S2, a molar ratio of said CdSe quantum dot core with respect to said first cadmium precursor with respect to said first zinc precursor is $1:2*10^3:2*10^4 \sim 1:2*10^4:2*10^5$, and a molar ratio of said CdSe quantum dot core with respect to said selenium precursor is $1:5*10^3 \sim 1:5*10^4$.

15. The synthesis method according to claim 4, wherein said first cadmium precursor and said second cadmium precursor are each independently selected from any one of cadmium carboxylates with a carbon chain length of 8 to 22; and said first zinc precursor, said second zinc precursor, and said third zinc precursor are each independently selected from any one of zinc carboxylates with a carbon chain length of 8 to 22; said first sulfur precursor is one of a non-coordinating solution of sulfur and a trialkylphosphine solution of sulfur.

16. The synthesis method according to claim 4, wherein in step S3, a molar ratio of said CdSe quantum dot core with respect to said second cadmium precursor with respect to said second zinc precursor is $1:2*10^3:2*10^4 \sim 1:2*10^4:2*10^5$, and a molar ratio of said CdSe quantum core with respect to said first sulfur precursor is $1:2*10^4 \sim 1:2*10^5$.

17. The synthesis method according to claim 4, wherein wherein in step S4, a molar ratio of said CdSe quantum dot core with respect to said third zinc precursor is $1:5*10^4 \sim 1:5*10^5$, and a molar ratio of said CdSe quantum core with respect to said second sulfur precursor is $1:0 \sim 1:2*10^5$.

18. A QLED device, comprising a quantum dot layer comprising a quantum dot, wherein said quantum dot is said yellow-red spectral quantum dot according to claim 1.

19. A quantum dot composition, comprising a yellow-red spectral quantum dot, wherein said yellow-red spectral quantum dot is said yellow-red spectral quantum dot according to claim 1.

20. A QLED device, comprising a quantum dot layer comprising a quantum dot, wherein said quantum dot is the yellow-red spectral quantum dot prepared by said method according to claim 4.

* * * * *